(12) United States Patent
Bai

(10) Patent No.: US 12,402,280 B2
(45) Date of Patent: Aug. 26, 2025

(54) HEAT DISSIPATION DEVICE AND ELECTRONIC APPARATUS

(71) Applicant: Lenovo (Beijing) Limited, Beijing (CN)

(72) Inventor: Jiajing Bai, Beijing (CN)

(73) Assignee: LENOVO (BEIJING) LIMITED, Beijing (CN)

( * ) Notice: Subject to any disclaimer, the term of this patent is extended or adjusted under 35 U.S.C. 154(b) by 292 days.

(21) Appl. No.: 18/161,309

(22) Filed: Jan. 30, 2023

(65) Prior Publication Data

US 2023/0247796 A1   Aug. 3, 2023

(30) Foreign Application Priority Data

Jan. 30, 2022 (CN) .......................... 202210114090.1

(51) Int. Cl.
*H05K 7/20* (2006.01)
(52) U.S. Cl.
CPC ................ *H05K 7/20336* (2013.01)
(58) Field of Classification Search
CPC .................................................. H05K 7/20336

USPC .......................................................... 361/700
See application file for complete search history.

(56) References Cited

U.S. PATENT DOCUMENTS

| 2011/0174465 A1* | 7/2011 | Liu ........................ F28D 15/046 |
| | | 165/104.26 |
| 2020/0340756 A1* | 10/2020 | Lin ...................... F28D 15/0283 |
| 2021/0136955 A1* | 5/2021 | Wakaoka ............... F28D 15/046 |

FOREIGN PATENT DOCUMENTS

TW       201423023 A  *  6/2014  ......... F28D 15/0233

* cited by examiner

*Primary Examiner* — Zhengfu J Feng
(74) *Attorney, Agent, or Firm* — ANOVA LAW GROUP, PLLC

(57) ABSTRACT

A heat dissipation device includes a body and at least two first capillary structures. The body includes an accommodation chamber. The accommodation chamber includes a heat dissipation medium. The at least two first capillary structures are stripe-shaped and arranged in the accommodation chamber along a flow direction of the heat dissipation medium. A first space is formed between two neighboring first capillary structures. A liquid heat dissipation medium in the two neighboring first capillary structures is evaporated into the first space.

16 Claims, 2 Drawing Sheets

HEAT DISSIPATION DEVICE AND ELECTRONIC APPARATUS

CROSS-REFERENCE TO RELATED APPLICATION

This application claims priority to Chinese Patent Application No. 202210114090.1, filed on Jan. 30, 2022, the entire content of which is incorporated herein by reference.

TECHNICAL FIELD

The present disclosure relates to the heat dissipation technology field and, more particularly, to a heat dissipation device and an electronic apparatus.

BACKGROUND

A heat dissipation device is a common device. The existing heat dissipation device has poor heat dissipation performance.

SUMMARY

Embodiments of the present disclosure provide a heat dissipation device, including a body and at least two first capillary structures. The body includes an accommodation chamber. The accommodation chamber includes a heat dissipation medium. The at least two first capillary structures are stripe-shaped and arranged in the accommodation chamber along a flow direction of the heat dissipation medium. A first space is formed between two neighboring first capillary structures. A liquid heat dissipation medium in the two neighboring first capillary structures is evaporated into the first space.

Embodiments of the present disclosure provide an electronic apparatus, including a heat dissipation device and a heat generation element. The heat dissipation device includes a body and at least two first capillary structures. The body includes an accommodation chamber. The accommodation chamber includes a heat dissipation medium. The at least two first capillary structures are stripe-shaped and arranged in the accommodation chamber along a flow direction of the heat dissipation medium. A first space is formed between two neighboring first capillary structures. A liquid heat dissipation medium in the two neighboring first capillary structures is evaporated into the first space. The heat dissipation device is configured to dissipate heat of the heat generation element.

REFERENCE NUMERALS

Figure 1:
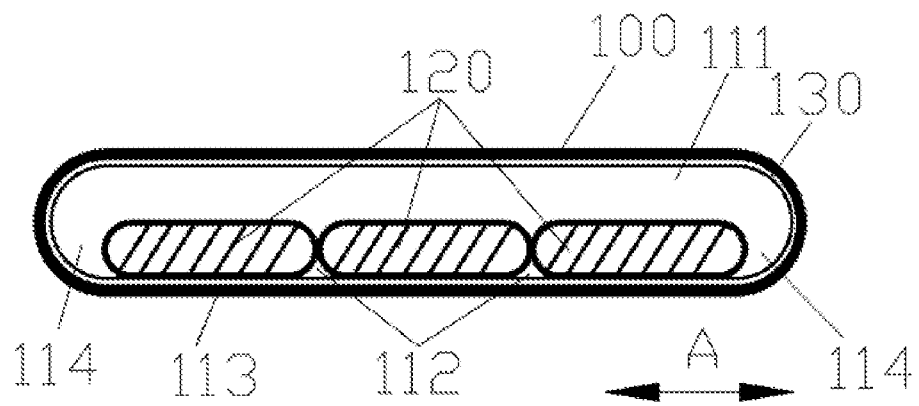
FIG. 1 illustrates a schematic structural diagram of a cooling device according to embodiments of the present disclosure.

| | | |
|---|---|---|
| 110 Body | 111 Accommodation chamber | 112 First space |
| 113 Operation wall | 114 Second space | 115 Third space |
| 120 First capillary structure | | 121 Recess |
| 130 Second capillary structure | | |

DETAILED DESCRIPTION OF THE EMBODIMENTS

The technical solution of the present disclosure is further described in detail with reference to the accompanying drawings and embodiments of the present disclosure.

In embodiments of the present disclosure, unless otherwise specified and limited, the term "connected" should be interpreted broadly. For example, the term "connected" can include an electrical connection, a communication between two elements, a direct connection, or an indirect connection via an intermediate medium. For those of ordinary skilled in the art, the specific meaning of the term can be understood according to a specific situation.

The term "first\second\third" in embodiments of the present disclosure is only used to distinguish similar objects and does not represent a specific order for the objects. "First\second\third" can exchange a specific order or sequence if allowed. Objects that are distinguished by "first\second\third" can be interchanged under an appropriate situation. Thus, embodiments of the present disclosure described herein can be implemented in an order other than those illustrated or described herein.

An electronic apparatus of embodiments of the present disclosure can be described in detail below with reference to FIGS. 1 to 4.

A heat dissipation device includes a body 110 and at least two first capillary structures 120. The body 110 includes an accommodation chamber 111. The accommodation chamber 111 can accommodate a heat dissipation medium. The at least two first capillary structures 120 can be strip-shaped. The at least two first capillary structures can be arranged in the accommodation chamber 111 along a flow direction of the heat dissipation medium. A first space 112 is formed between two neighboring first capillary structures 120. The liquid heat dissipation medium in the two neighboring first capillary structures 120 can be evaporated to the first space 112. The first space 112 can form a flow channel of the gaseous heat dissipation medium. The liquid heat dissipation medium in the two neighboring first capillary structures 120 can quickly form the gaseous heat dissipation medium in the first space 112, which can flow. Thus, a route and time for forming the gaseous heat dissipation medium from the liquid heat dissipation medium can be greatly reduced, and the heat dissipation capability of the heat dissipation device can be improved.

In embodiments of the present disclosure, a structure of the body 110 is not limited. For example, the body 110 can be a cuboid structure. For another example, the body 110 can be a tube-shaped structure.

In embodiments of the present disclosure, a type of the heat dissipation medium is not limited as long as the heat dissipation medium can be converted between a gaseous state and a liquid state. For example, the heat dissipation medium can be water.

In some embodiments, a flow direction of the heat dissipation medium can be a direction in which the heat dissipation medium flows between an evaporation end of the body 110 and a condensation end of the body 110. For example, when the body 110 has a tube-shaped structure, the flow direction of the heat dissipation medium can be a length direction of the tube-shaped structure.

In embodiments of the present disclosure, a structure of the first capillary structure 120 is not limited.

For example, the first capillary structure 120 can include a first stripe-shaped member and a second stripe-shaped member. The second stripe-shaped member and the first stripe-shaped member can be arranged alternatively to form the first capillary structure 120.

In some embodiments, a cross-section of the second stripe-shaped member can be the same as or different from a cross-section of the first stripe-shaped member. For example, the cross-section of the second stripe-shaped member and the cross-section of the first stripe-shaped member can be both circular or elliptical. A diameter of the second stripe-shaped member can be different from a diameter of the first stripe-shaped member.

In some embodiments, the first capillary structure 120 may further include a third stripe-shaped member. The third stripe-shaped member can be staggered with the first stripe-shaped member and the second stripe-shaped member to form the first capillary structure 120.

A cross-section of the third stripe-shaped member, the cross-section of the second stripe-shaped member, and the cross-section of the first stripe-shaped member can be the same or different. For example, the third stripe-shaped member, the first stripe-shaped member, and the second stripe-shaped member can be column-shaped. At least two of the first stripe-shaped member, the second stripe-shaped member, and the third stripe-shaped member can have different diameters.

In embodiments of the present disclosure, a material of the first capillary structure 120 is not limited. For example, the first capillary structure 120 can have a non-metal structure. Thus, the first capillary structure 120 can have absorbability to retain the liquid heat dissipation medium in the first capillary structure 120.

Figure 3:
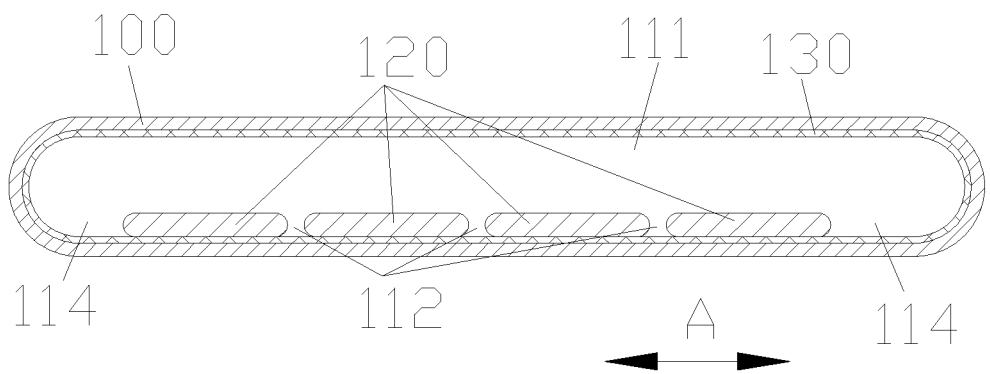
FIG. 3 illustrates a schematic structural diagram of a cooling device according to embodiments of the present disclosure.

In some embodiments, a manner of forming the first space 112 between two neighboring first capillary structures 120 is not limited. For example, as shown in FIG. 1, two ends where two neighboring first capillary structures 120 contact with each other are non-planar. Under the contact of the neighboring two first capillary structures 120, the first space 112 can be formed by the contacted ends of the two neighboring first capillary structures 120. For another example, as shown in FIG. 3, a first interval is formed between the two neighboring first capillary structures 120.

In some embodiments, an arrangement of the at least two first capillary structures 120 is not limited.

For example, the at least two first capillary structures 120 can be arranged in a first direction in parallel. The first direction can satisfy a perpendicular condition with a flow direction of the heat dissipation medium.

In some embodiments, the first direction is not limited. For example, the flow direction of the heat dissipation medium can be a length direction of the body 110, and the first direction can be a width direction of the body 110. In some embodiments, the perpendicular condition can be perpendicular or substantially perpendicular.

For another example, the at least two first capillary structures 120 can be arranged in parallel in a second direction. The second direction can satisfy a perpendicular condition with the flow direction of the heat dissipation medium.

In some embodiments, the second direction is not limited. For example, the flow direction of the heat dissipation medium can be the length direction of the body 110, and the second direction can be a thickness direction of the body 110. The second direction can satisfy a perpendicular condition with the first direction.

In some embodiments, a cross-section of the first capillary structure 120 in the flow direction of the heat dissipation medium can remain unchanged or can be varied. For example, thicknesses of the at least two first capillary structures 120 in the evaporation region can be greater than thicknesses of the at least two first capillary structures 120 in the condensation region. Widths of the at least two first capillary structures 120 can remain unchanged in the flowing direction of the heat dissipation medium. Thus, more liquid heat dissipation medium can be stored in the evaporation region through the first capillary structure 120 with a larger cross-section, and more liquid heat dissipation medium can absorb heat to evaporate. In the condensation region, the first capillary structure 120 can be mainly configured to transfer the liquid heat dissipation medium to return the liquid heat dissipation medium to the evaporation region. By setting the cross-section of the first capillary structure 120 in the condensation region to be smaller, the space of the gaseous heat dissipation medium in the condensation region can be increased. More gaseous heat dissipation medium can be rapidly condensed in a relatively large space to form the liquid heat dissipation medium. By setting the thicknesses of the at least two first capillary structures 120 in the evaporation region to be greater than the thicknesses of the at least two first capillary structures 120 in the condensation region, the heat dissipation ability of the heat dissipation device can be greatly improved.

In embodiments of the present disclosure, as shown in FIGS. 1 and 3, the at least two first capillary structures 120 are arranged in parallel on a side of an operation wall 113 of the body 110 in the first direction. The operation wall 113 can be a wall body on a side where the body 110 is connected to a heat generation element. The heat dissipation capability of the heat dissipation device to the heat generation element can be greatly improved through the at least two first capillary structures 120.

Figure 2:
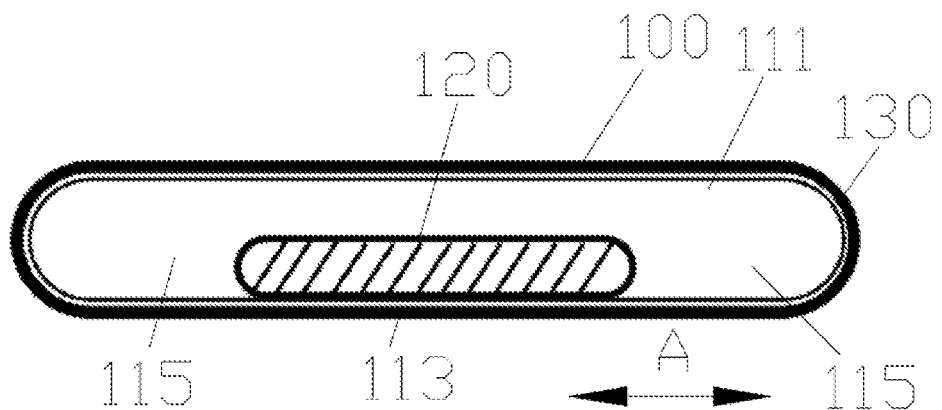
FIG. 2 illustrates a schematic structural diagram of a cooling device according to embodiments of the present disclosure.

In some embodiments, as shown in FIG. 1 and FIG. 2, with the same structure of the body 110, if one first capillary structure 120 is arranged in the accommodation chamber 111, the width of the first capillary structure 120 is set to be larger in the first direction to cause the heat dissipation device to have a larger heat dissipation capability. Two ends of the first capillary structure 120 can form third spaces 115 with sidewalls of the body 110 in the first direction A. The liquid heat dissipation medium in the two ends of the first capillary structure 120 can evaporate into the third space 115 to form the gaseous heat dissipation medium to flow. If the width of the first capillary structure 120 in the first direction is set too large, a distance between a part of the liquid heat dissipation medium in the first capillary structure 120 and the third space 115 can be too large to be evaporated into the third space 115 to form the gaseous heat dissipation medium to flow, which can greatly lower the heat dissipation capability of the heat dissipation device. Thus, if one first capillary structure 120 is arranged in the accommodation chamber 111, the width of the first capillary structure 120 in the first direction A can be limited. Even if the width of the first capillary structure 120 in the first direction A is set to be relatively large, the heat dissipation capability of the heat dissipation device can be low because a part of the liquid heat dissipation medium in the first capillary structure 120 cannot evaporate to form the gaseous heat dissipation medium. Meanwhile, the gaseous heat dissipation medium can be condensed on an inner wall of the accommodation chamber 111 to form the liquid heat dissipation medium. The liquid heat dissipation medium can flow back to the first capillary structure 120 along the inner wall of the accommodation chamber 111. Since the width of the first capillary structure 120 cannot be set to be large in the first direction A, the third space 115 can be relatively large, a route of the liquid heat dissipation medium flowing back to the first capillary structure 120 through the third space 115 along the inner wall of the accommodation chamber 111 can become longer. Thus, the time for the liquid heat dissipation medium to flow back to the first capillary structure 120 can be greatly increased. Therefore, a period of the liquid heat dissipation medium evaporating again to form the gaseous heat dissipation medium can be increased, which greatly lowers the heat dissipation efficiency of the heat dissipation medium and lowers the heat dissipation ability of the heat dissipation device. As shown in FIG. 1, the at least two first capillary structures 120 are arranged in the first direction. The first space 112 is formed between the two adjacent first capillary structures 120. Thus, the liquid heat dissipation medium in the two adjacent first capillary structures 120 can be rapidly evaporated to the first space 112 to form the gaseous heat dissipation medium to flow. Since the at least two first capillary structures 120 are arranged, a width of a single first capillary structure 120 in the first direction can be greatly reduced. Thus, the liquid heat dissipation medium in the first capillary structures 120 can be rapidly converted into the gaseous heat dissipation medium. The widths of the at least two first capillary structures 120 in the first direction can be set to be relatively large. Thus, the route of the liquid heat dissipation medium flowing back to the first capillary structures 120 along the inner wall of the accommodation chamber 111 can be shortened, which greatly reduces the time of the liquid heat dissipation medium flowing back to the first capillary structures 120. Therefore, the period of the liquid heat dissipation medium being re-evaporated to form the gaseous heat dissipation medium can be shortened, which greatly improves the heat dissipation efficiency of the heat dissipation medium and improves the heat dissipation ability of the heat dissipation device.

In some embodiments, the second spaces 114 can be formed by the two ends of the at least two first capillary structures 120 and the sidewalls of the body 110 in the first direction. The liquid heat dissipation medium in the first capillary structures 120 at the two ends of the at least two first capillary structures 120 can be evaporated to the second spaces 114. Thus, the liquid heat dissipation medium in the first capillary structures 120 at the two ends of the at least two first capillary structures 120 can be quickly evaporated to form the gaseous heat dissipation medium in the second spaces 114 to flow.

In some embodiments, the two ends of the at least two first capillary structures 120 can refer to two ends of the at least two first capillary structures 120 when being used as a whole.

In some embodiments, the liquid heat dissipation medium in the two neighboring first capillary structures 120 can be evaporated to the first spaces 112. The liquid heat dissipation medium in the first capillary structures 120 at the two ends of the at least two first capillary structures 120 can be evaporated to the second spaces 114. Thus, gaseous heat dissipation medium spaces can be formed at two ends of each first capillary structure 120. Therefore, the liquid heat dissipation medium in the at least two first capillary structures 120 can be quickly evaporated to form the gaseous heat dissipation medium, which greatly improves the heat dissipation ability of the heat dissipation device.

Figure 4:
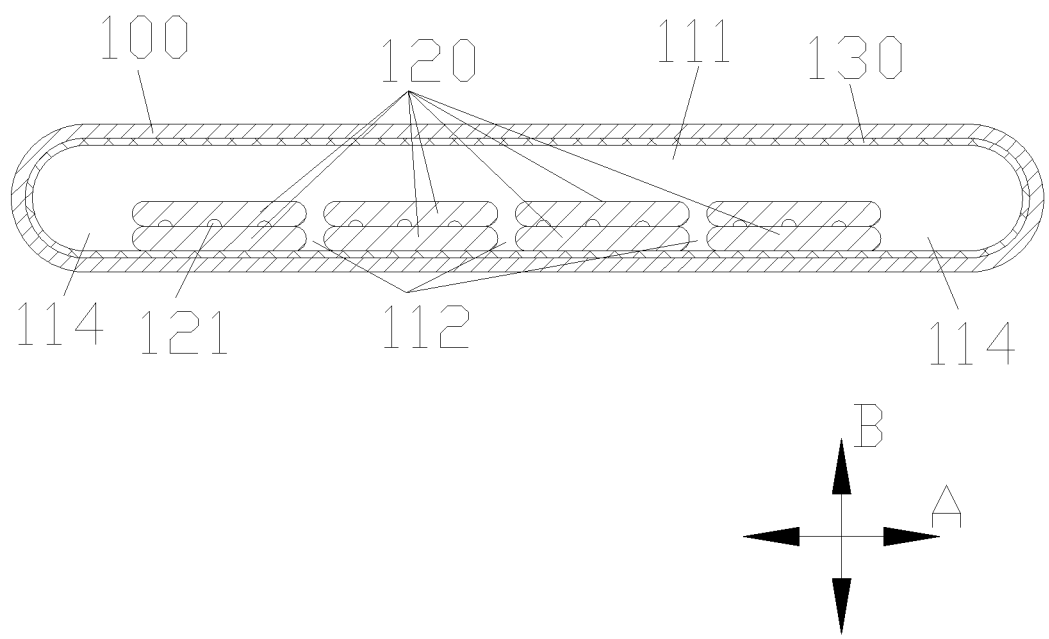
FIG. 4 illustrates a schematic structural diagram of a cooling device according to embodiments of the present disclosure.

In some embodiments of the present disclosure, as shown in FIG. 4, a first part of the first capillary structures 120 of the at least two first capillary structures 120 is arranged on the side of the operation wall of the body 110 in parallel in the first direction A. The operation wall 113 can be a sidewall of the body 110 connected to the heat generation element. A second part of the first capillary structures 120 of the at least two first capillary structures 120 can be arranged in parallel in the second direction B. The first direction can satisfy the perpendicular condition with the flow direction of the heat dissipation medium. The second direction and the first direction can satisfy the perpendicular condition. Thus, the cross-section of the single first capillary structure 120 can be set to be relatively small. A first space 112 is formed between two neighboring first capillary structures 120. Thus, the liquid heat dissipation medium in the single first capillary structure 120 can be evaporated more quickly to form the gaseous heat dissipation medium, which greatly improves the heat dissipation ability of the heat dissipation device.

In some embodiments, a manner of forming the first space 112 by neighboring first capillary structures 120 of the first part of the first capillary structures 120, and a manner of forming the first space 112 by neighboring first capillary structures 120 in the second part of the first capillary structures 120 can be similar to the manner of forming the first space 112 between the two neighboring first capillary structures 120 and are not repeated here.

For example, a first interval can be formed between the neighboring first capillary structures 120 in the first part of the first capillary structures 120. Ends where the neighboring first capillary structures 120 of the second part of the first capillary structures 120 contact with each other can be non-planar.

For example, as shown in FIG. 4, the first interval is formed between the neighboring first capillary structures 120 of the first part of the first capillary structures 120. The first space 112 can be formed through the first interval. Recesses 121 are arranged on surfaces of a part of the first capillary structures 120 of the second part of the first capillary structures 120 close to the neighboring first capillary structures 120. The first space 112 can be formed through the recesses 121 of the second part of the first capillary structures 120.

In some embodiments, the neighboring first capillary structures 120 of the second part of the first capillary structures 120 can contact with each other through a surface-to-surface contact. Thus, the heat of the heat generation element can be transferred between the neighboring first capillary structures 120. The liquid heat dissipation medium can be used to quickly form the gaseous heat dissipation medium in the recesses 121 through the recesses 121, which can greatly improve the heat dissipation ability of the heat dissipation device.

In some embodiments, a shape of the cross-section of the recess 121 is not limited. For example, the cross-section of the recess 121 can be semicircular or rectangular.

In some embodiments of the present disclosure, the heat dissipation device can further include a second capillary structure 130. The second capillary structure 130 can be arranged on the inner surface forming the accommodation chamber 111. The gaseous heat dissipation medium can be condensed into a liquid state in the second capillary structure 130. The liquid heat dissipation medium can flow to the first capillary structure 120 based on the second capillary structure 130 and be evaporated again in the first capillary structure 120.

In some embodiments, at least two first capillary structures 120 can be in contact with the second capillary structure 130. The heat of the heat generation element can be transferred to the first capillary structures 120 through the second capillary structures 130. When the heat dissipation device does not include the second capillary structure 130, the first capillary structure 120 can directly contact the inner surface forming the accommodation chamber 111.

In the present disclosure, structures of the first capillary structure 120 and the second capillary structure 130 are not limited. For example, the second capillary structure 130 can have a metal mesh structure, and the first capillary structure 120 can have a non-metal structure. Thus, the first capillary structure 120 can have absorbability. The liquid heat dissipation medium can be adsorbed into the first capillary structure 120. The liquid heat dissipation medium adsorbed into the first capillary structure 120 can absorb the heat and evaporates into the accommodation chamber 111. The gaseous heat dissipation medium can be condensed in the second capillary structure 130.

The heat dissipation device of embodiments of the present disclosure can include the body 110 having the accommodation chamber 111, the heat dissipation medium arranged in the accommodation chamber 111, and the at least two first capillary structures 120. The at least two first capillary structures 120 can be in a stripe shape and can be arranged in the accommodation chamber 111 along the flow direction of the heat dissipation medium. The first space 112 can be formed between the two neighboring first capillary structures 120. The liquid heat dissipation medium in the two neighboring first capillary structures 120 can be evaporated into the first space 112. A flow channel of the gaseous heat dissipation medium can be formed by the first space 112. The liquid heat dissipation medium in the two neighboring first capillary structures 120 can be used to quickly form the gaseous heat dissipation medium into the first space 112 to flow. Thus, the route and time of forming the gaseous heat dissipation medium from the liquid heat dissipation medium can be greatly reduced, and the heat dissipation ability of the heat dissipation device can be improved.

Embodiments of the present disclosure further provide an electronic apparatus. The electronic apparatus can include the heat dissipation device and heat generation element of embodiments of the present disclosure. The heat dissipation device can be configured to dissipate heat for the heat generation element.

In some embodiments, the structure of the electronic apparatus is not limited. For example, the electronic apparatus can include a computer or a mobile phone.

The above description only describes embodiments of the present disclosure. However, the scope of the present disclosure is not limited here. Those skilled in the art can easily think of the changes or replacements within the technical scope of the present disclosure. These changes and replacements shall be within the scope of the present disclosure. Therefore, the protection scope of the present invention shall be subjected to the scope of the claims.

What is claimed is:

1. A heat dissipation device, comprising:
a body including an accommodation chamber, the accommodation chamber including a heat dissipation medium;
at least two first capillary structures being stripe-shaped and arranged in the accommodation chamber along a flow direction of the heat dissipation medium, a first space being formed between two neighboring first capillary structures, wherein:
a liquid heat dissipation medium in the two neighboring first capillary structures is evaporated into the first space;
a first capillary structure of the at least two first capillary structures includes:
a first stripe-shaped member having a cross-section; and
a second stripe-shaped member having a cross-section different from the cross-section of the first stripe-shaped member and being alternatively arranged with the first stripe-shaped member to form the first capillary structure.

2. The heat dissipation device according to claim 1, wherein:
the at least two first capillary structures are arranged in parallel in a first direction on a side of an operation wall of the body;
the operation wall is a wall on a side where the body is connected to the heat generation element; and
the first direction and the flow direction of the heat dissipation medium satisfy a perpendicular condition.

3. The heat dissipation device according to claim 2, wherein:
second spaces are formed between two ends of the at least two first capillary structures and a sidewall of the body in the first direction; and
liquid heat dissipation medium of the first capillary structures at the two ends of the at least two first capillary structures is evaporated into the second space.

4. The heat dissipation device according to claim 3, wherein:
the two neighboring first capillary structures are in contact; or
a first interval is formed between the two neighboring first capillary structures.

5. The heat dissipation device according to claim 1, wherein the first capillary structure further includes:
a third stripe-shaped member being staggered with the first stripe-shaped member and the second stripe-shaped member to form the first capillary structure; wherein:
the third stripe-shaped member, the first stripe-shaped member, and the second stripe-shaped member are column-shaped; and
at least two of the first stripe-shaped member, the second stripe-shaped member, and the third stripe-shaped member have different diameters.

6. The heat dissipation device according to claim 1, wherein:
a first part of first capillary structures of the at least two first capillary structures are arranged in parallel in a first direction on a side of an operation wall of the body, and the operation wall is a wall on a side where the body is connected to a heat generation element;
a second part of first capillary structures of the at least two first capillary structures are arranged in parallel in a second direction; and the first direction and the flow direction of the heat dissipation medium satisfy a perpendicular condition, and the second direction and the first direction satisfy the perpendicular condition.

7. The heat dissipation device according to claim 1, wherein thicknesses of the at least two first capillary structures in an evaporation region are greater than thicknesses of the at least two first capillary structures in a condensation region.

8. The heat dissipation device according to claim 1, further comprising:
a second capillary structure arranged on the inner surface of the accommodation chamber, a gaseous heat dissipation medium being condensed into a liquid state in the second capillary structure;
wherein the second capillary structure has a metal mesh structure, and the first capillary structure has a non-metal structure.

9. An electronic apparatus comprising:
a heat dissipation device including:
a body including an accommodation chamber, the accommodation chamber including a heat dissipation medium; and
at least two first capillary structures being stripe-shaped and arranged in the accommodation chamber along a flow direction of the heat dissipation medium, a first space being formed between two neighboring first capillary structures, wherein:
a liquid heat dissipation medium in the two neighboring first capillary structures is evaporated into the first space;
a first capillary structure of the at least two first capillary structures includes:
a first stripe-shaped member having a cross-section; and
a second stripe-shaped member having a cross-section different from the cross-section of the first stripe-shaped member and being alternatively arranged with the first stripe-shaped member to form the first capillary structure; and
a heat generation element, the heat dissipation device being configured to dissipate heat of the heat generation element.

10. The electronic apparatus according to claim 9, wherein:
the at least two first capillary structures are arranged in parallel in a first direction on a side of an operation wall of the body;
the operation wall is a wall on a side where the body is connected to the heat generation element; and
the first direction and the flow direction of the heat dissipation medium satisfy a perpendicular condition.

11. The electronic apparatus according to claim 10, wherein:
second spaces are formed between two ends of the at least two first capillary structures and a sidewall of the body in the first direction; and
liquid heat dissipation medium in first capillary structures at the two ends of the at least two first capillary structures is evaporated into the second space.

12. The electronic apparatus according to claim 11, wherein:
the two neighboring first capillary structures are in contact; or
a first interval is formed between the two neighboring first capillary structures.

13. The electronic apparatus according to claim 9, wherein the first capillary structure further includes:
a third stripe-shaped member being staggered with the first stripe-shaped member and the second stripe-shaped member to form the first capillary structure;
wherein:
the third stripe-shaped member, the first stripe-shaped member, and the second stripe-shaped member are column-shaped; and
at least two of the first stripe-shaped member, the second stripe-shaped member, and the third stripe-shaped member have different diameters.

14. The electronic apparatus according to claim 9, wherein:
a first part of first capillary structures of the at least two first capillary structures are arranged in parallel in a first direction on a side of an operation wall of the body, and the operation wall is a wall on a side where the body is connected to a heat generation element;
a second part of first capillary structures of the at least two first capillary structures are arranged in parallel in a second direction; and
the first direction and the flow direction of the heat dissipation medium satisfy a perpendicular condition, and the second direction and the first direction satisfy the perpendicular condition.

15. The electronic apparatus according to claim 9, wherein thicknesses of the at least two first capillary structures in an evaporation region are greater than thicknesses of the at least two first capillary structures in a condensation region.

16. The electronic apparatus according to claim 9, wherein the heat dissipation device further includes:
a second capillary structure arranged on the inner surface of the accommodation chamber, a gaseous heat dissipation medium being condensed into a liquid state in the second capillary structure;
wherein the second capillary structure has a metal mesh structure, and the first capillary structure has a non-metal structure.

* * * * *